United States Patent [19]
Linn et al.

[11] Patent Number: 5,569,620
[45] Date of Patent: *Oct. 29, 1996

[54] BONDED WAFER PROCESSING WITH METAL SILICIDATION

[75] Inventors: Jack H. Linn, Melbourne; Robert K. Lowry, Melbourne Beach; George V. Rouse, Indiatlantic, all of Fla.; James F. Buller, Austin, Tex.

[73] Assignee: Harris Corporation, Melbourne, Fla.

[ * ] Notice: The term of this patent shall not extend beyond the expiration date of Pat. No. 5,387,555.

[21] Appl. No.: 351,933

[22] Filed: Dec. 8, 1994

Related U.S. Application Data

[63] Continuation of Ser. No. 939,786, Sep. 3, 1992, Pat. No. 5,387,555.

[51] Int. Cl.⁶ .......................... H01L 21/30; H01L 21/46
[52] U.S. Cl. ............... 437/62; 437/200; 437/225; 437/974; 148/DIG. 12
[58] Field of Search .................. 437/974, 62, 200, 437/946, 86, 225; 148/DIG. 12, DIG. 135, DIG. 147

[56] References Cited

U.S. PATENT DOCUMENTS

| | | | |
|---|---|---|---|
| 4,826,787 | 5/1989 | Muto et al. | 437/208 |
| 4,980,306 | 12/1990 | Shimbo | 437/34 |
| 5,098,861 | 3/1992 | Blackstone | 437/200 |
| 5,102,821 | 4/1992 | Moslehi | 437/62 |
| 5,169,472 | 12/1992 | Goebel | 156/281 |
| 5,387,555 | 2/1995 | Linn et al. | 437/225 |

FOREIGN PATENT DOCUMENTS

| | | | |
|---|---|---|---|
| 62-122148 | 6/1987 | Japan | 148/DIG. 12 |
| 2-148821 | 6/1990 | Japan | 148/DIG. 12 |
| 2-206118 | 10/1990 | Japan . | |

OTHER PUBLICATIONS

M. Shimbo, K. Furukawa, K. Fukuda, & K. Tanzawa, "Silicon-to-Silicon Direct Bonding Method", *J. Appl. Physics* 60 (8), pp. 2987–2989, Oct. 15, 1986.
Sorab K. Ghandhi, "Silicides", *VLSI Fabrication Principles*, John Wiley & Sons, pp. 435–437, 1983.
Stanley Wolf & Richard N. Tauber, "Silicon Processing for the VLSI Era", *Lattice Press*, vol. 1., pp. 390–391, 1986.
S. P. Murarka, "Refractory Silicides For Integrated Circuits", *J. Vac. Science Technology*, 17 (4), pp. 775–792, Jul./Aug. 1980.

*Primary Examiner*—T. N. Quach
*Attorney, Agent, or Firm*—Nixon, Hargrave, Devans & Doyle

[57] ABSTRACT

Low temperature silicon-on-insulator wafer bonding using a silicide bond formation reaction. Dielectric isolation with silicon dioxide, diamond, silicon-nitride, and so forth yields buried resistors under trench isolated silicon islands. Buried dielectrics can be thermally susceptible films like diamond due to the low temperature of the bonding silicidation reaction. Bonding silicides also provide thermal dissipating layer between a buried diamond layer and a handle wafer for good overall thermal conductivity. Bonding silicides also act as diffusion barriers.

13 Claims, 8 Drawing Sheets

BONDED WAFER PROCESSING WITH METAL SILICIDATION

This is a continuation of application Ser. No. 07/939,786, filed on Sep. 3, 1992, U.S. Pat. No. 5,387,555.

CROSS-REFERENCE TO RELATED APPLICATIONS

The following U.S. patent applications are assigned to the assignee of this application and disclose related subject matter: Ser. No. 07/845,549, , filed Feb. 12, 1992, U.S. Pat. No. 5,266,135, Ser. No. 07/921,197, filed Jul. 28, 1992, U.S. Pat. No. 5,362,667.

BACKGROUND AND SUMMARY OF THE INVENTIONS

The present invention relates to electronic integrated circuits and methods of fabrication, and, more particularly, to dielectrically isolated semiconductor integrated circuits and related fabrication methods.

Silicon-on-Insulator Substrates

Integrated circuits fabricated in silicon-on-insulator substrates offer performance advantages including freedom from latchup for CMOS structures, high packing density, low parasitic capacitance, low power consumption, radiation hardness, high voltage operation, and the possibility of three dimensional integration. Indeed, isolation trenches extending through the silicon layer down to the insulation provide a simple approach to dielectric isolation of integrated circuit devices. The sidewalls of such trenches are coated with an insulator, usually silicon dioxide ("oxide"), and the remaining portion of trench opening, if any, is filled with a filler which is usually polycrystalline silicon. Diffused PN junctions can also be used for lateral isolation.

Additionally, silicon-on-insulator technology using very thin films offers special advantages for submicron devices. Scaling bulk devices tends to degrade their characteristics because of small-geometry effects, such as punch-through, threshold voltage shift, and subthreshold-slope degradation. The use of silicon-on-insulator devices suppresses these small-geometry effects. Therefore, even in the submicron VLSI era, silicon-on-insulator technology can offer even higher device performance than can bulk technology, along with the inherent advantages of silicon-on-insulator.

Silicon-on-insulator substrates may be fabricated in various ways: a crystalline silicon layer may be formed over an existing oxide layer either by laser or strip heater recrystallization of polysilicon deposited on the oxide or by selective epitaxial silicon growth over the oxide. However, the quality of such a silicon layer is generally inferior to that normally associated with bulk silicon. Other approaches form an oxide layer beneath an existing high quality silicon layer either by oxidizing a buried porous silicon layer or by oxygen ion implantation; however, such oxide is low quality and the silicon top layer may be damaged during the oxide layer formation.

Another approach to silicon-on-insulator is wafer bounding as described by J. Lasky et al., Silicon-On-Insulator (SOI) by Bonding and Etch-Back, 1985 IEDM Tech. Deg. 684. This wafer bonding process proceeds as follows: a lightly doped epitaxial layer of silicon is grown on a heavily doped silicon substrate, oxide is thermally grown on the epilayer, a second lightly doped silicon substrate is thermally oxidized, the two oxidized surfaces are pressed together. See FIG. 1a. The pressed together wafers are inserted into an oxidizing atmosphere at 1,100° C. to bond them as illustrated in FIG. 1b. Lastly, a preferential etch is used to remove the heavily doped substrate, leaving the thin, lightly doped epitaxially layer above the bonded thermally grown oxides which are now on the second substrate as shown in FIG. 1c. The resulting thin silicon layer above the thermally grown oxide has high quality and the oxide also retains its quality and may be thick, as might be desired for CMOS or high voltage devices, or then, as might be desired for shared element applications. FIG. 1d heuristically illustrates trench isolation with poly filled trenches isolating MOSFET and bipolar devices.

Conceptually, this process may meet all the desired goals for the ultimate silicon-on-insulator material (a specular finished crystalline silicon layer without dislocations and a back interface with the insulator of quality equal to the interface of thermally grown silicon dioxide on silicon; both the crystalline silicon layer and the insulator of variable thickness).

Another wafer bonding method, illustrated in FIGS. 2a–c and described in copending U.S. patent application Ser. No. 07/934,439, filed Feb. 12, 1992, U.S. Pat. No. 5,266,135, proceeds as follows. Start with a device wafer having a lightly doped epilayer on a heavily doped substrate and a handle wafer with a thick (4,000 A) oxide layer. Activate the surface of the device wafer with an acid or peroxide wash to enhance hydroxyl group formation. Place a drop of oxidant such as water plus hydrogen peroxide on the oxide, and squeeze the wafers together. See FIG. 2a. The drop of oxidant has a volume in the range of 0.8 to 8.0 microliters per square inch of wafer surface. Dry the squeezed wafers at room temperature for a day and then heat the squeezed wafers to 1150 degrees C for two hours. The heating drives an oxidation of the device wafer and the silicon-oxygen bonds formed fuse the two wafers. See FIG. 2b. Lastly, grind and etch the device wafer until exposure of the device epilayer. This completes the silicon-on-insulator substrate as shown in FIG. 2c. For applications requiring a thick (10–60 μm) silicon-on-insulator layer and a thicker (e.g., 4 μm) bottom oxide, but allowing some tolerance in the layer thickness, a slightly simpler process could be used. A uniformly lightly doped device wafer could be used, and the thinning process could be just grinding and polishing.

However, bonded wafers have problems of high temperature bonding which leads to film stress and delamination.

Bonded waters with silicon dioxide buried layers are also susceptible to contaminant diffusion as oxides are poor diffusion barriers to mobile ions like sodium. Contaminants introduced during the bonding process can easily diffuse to the device layer interface and result in electrical stability problems.

Features

The present invention provides silicon-on-insulator bonded wafer processing with the features of (1) relatively low temperature bonding by the use of low temperature metal silicidation reactions for bonding (e.g., 500–800 C), (2) better stress compensation by providing materials in the bonding zone which will produce silicides with closely matched coefficients of thermal expansion to that of the substrate wafers and buried dielectric layers for less warpage, (3) limiting contaminant migration by the use of a bonding zone which is a barrier to diffusion of mobile contaminants, (4) a method of simultaneously producing a buried doped layer in the silicon during the bonding process, (5) a conductive, dielectrically-isolated layer at the bonding zone, and (6) a thermally conductive layer at the bonding zone.

BRIEF DESCRIPTION OF THE DRAWINGS

The present invention will be described with reference to the accompanying drawings, which are schematic for clarity.

DESCRIPTION OF THE PREFERRED EMBODIMENTS

Silicidation Bonding

Figure 1A:
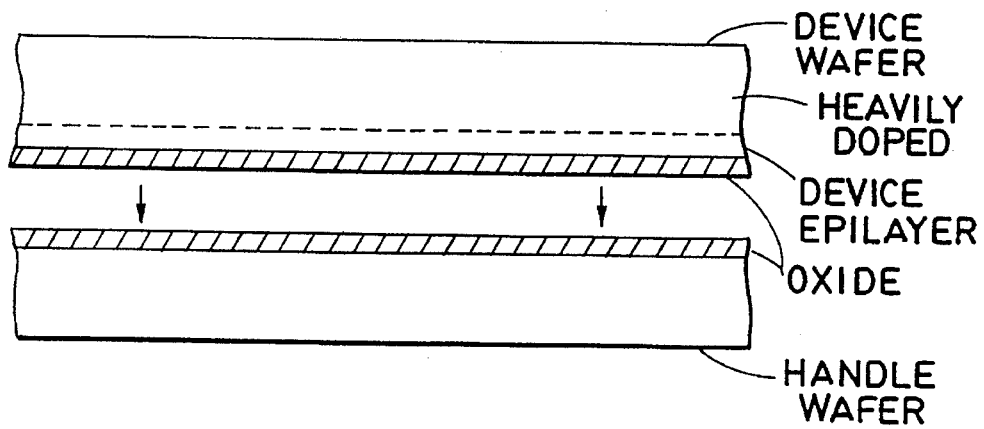
FIGS. 1a–1d illustrate in cross sectional elevation views known wafer bonding methods and integrated circuits.
Figure 1B:
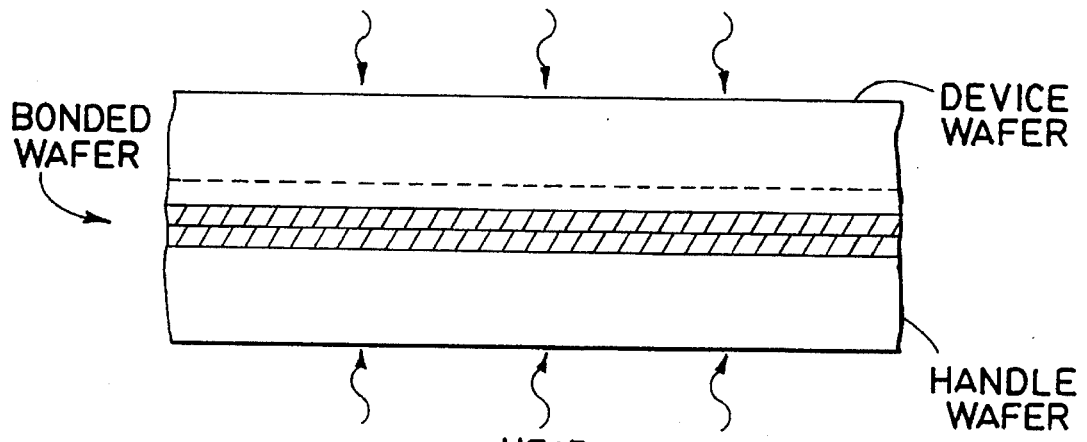
Figure 1C:
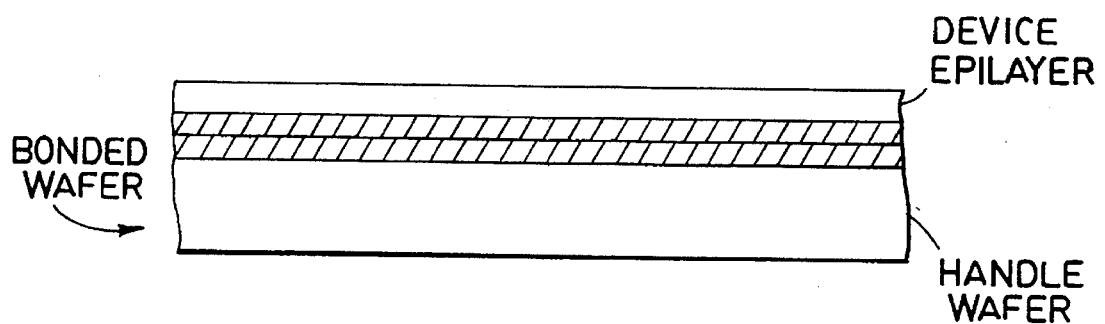
Figure 1D:
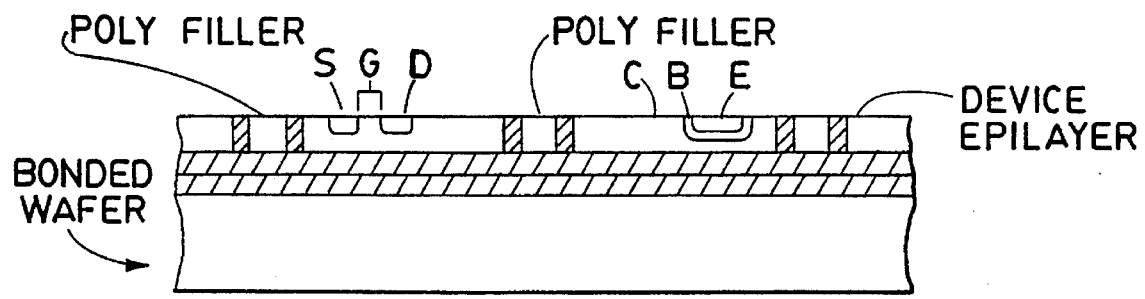

FIGS. 3a–f illustrate in cross sectional elevation view a first preferred embodiment method of silicon-on-insulator bonded wafer processing.

(a) Begin with a four inch diameter 500 μm thick silicon device wafer 302 and a comparable diameter 500 μm thick silicon handle wafer 312. Device wafer 302 has the doping type and resistivity (e.g., N type and 20 ohm-cm resistivity) desired for eventual device fabrication. Thermally oxidize device wafer 302 to form oxide layer 316. Oxide 316 will become the bottom oxide, so the oxide is grown to the desired bottom oxide thickness; for example, 2–4 μm. Alternatively, diamond or silicon nitride ("nitride") could be deposited on device wafer 302 to form the buried dielectric layer 316. A diamond thin film 316 could be deposited by a chemical vapor deposition (CVD) reaction of methane and hydrogen, and a nitride thin film could be deposited by a decomposition of silane and ammonia Deposit 500 Å, thick polysilicon layer 317 on oxide (or other dielectric) 316, or deposit a thicker polysilicon layer and polish it down to 500 Å. Then deposit a 500–1000 Å thick layer platinum 318 on polysilicon 317; see FIG. 3a. The deposition of polysilicon may be by silane decomposition and the deposition of platinum may be by sputtering. Handle wafer 312 only hzx native oxide on its surfaces.

Figure 2A:
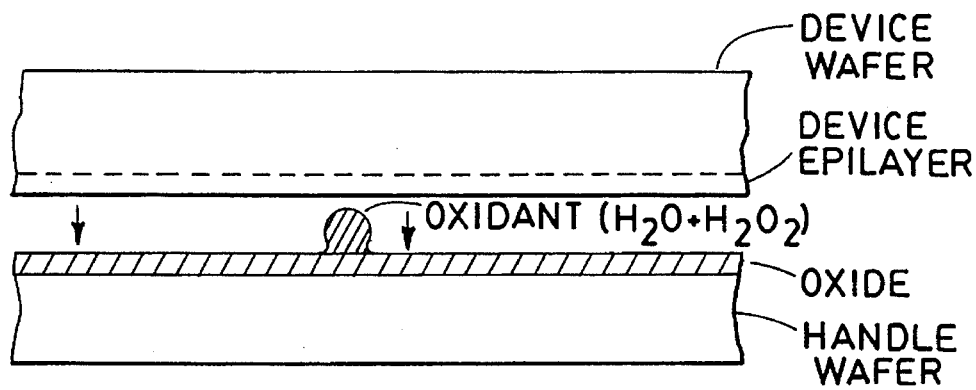
FIGS. 2a–2c illustrate in cross sectional elevation views a copending wafer bonding method.
Figure 2B:
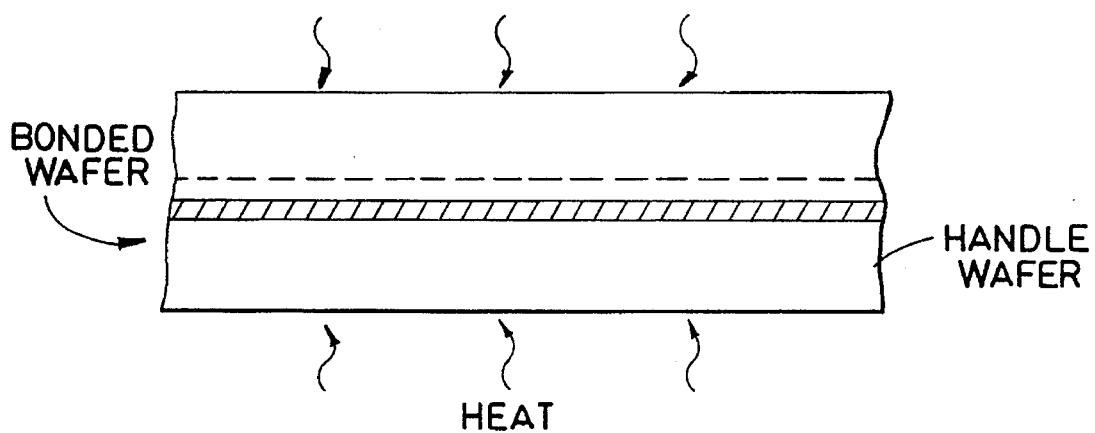
Figure 2C:
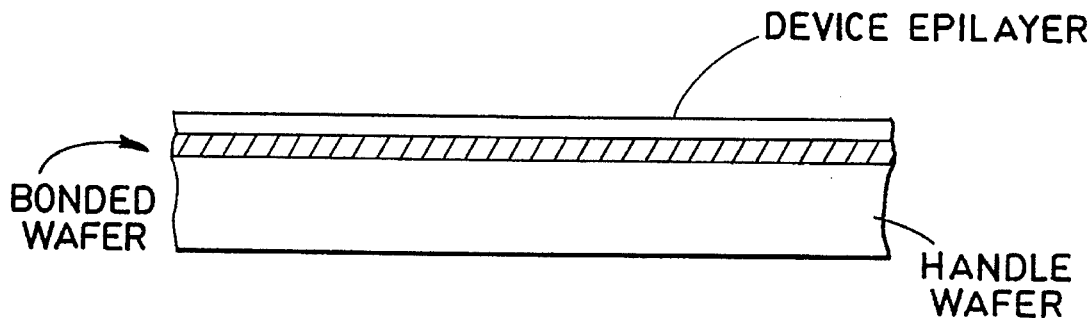
Figure 3A:
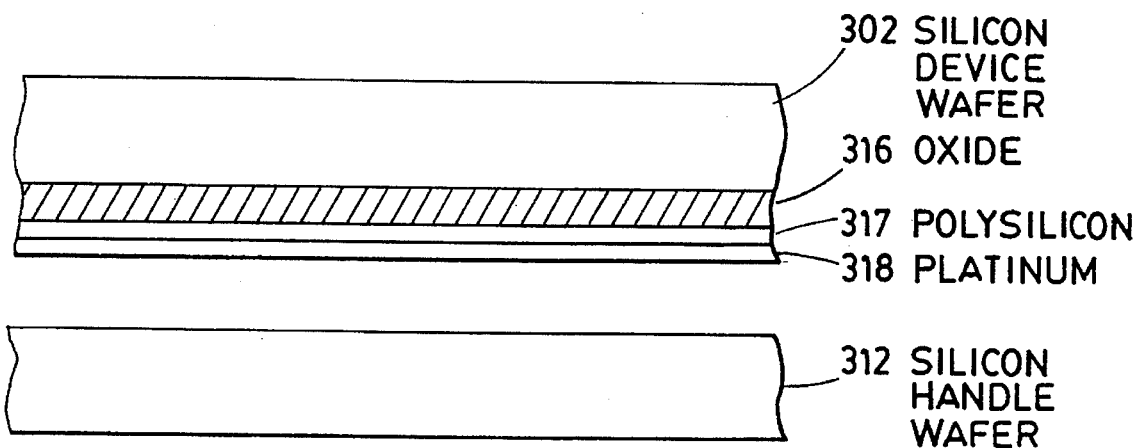
FIGS. 3a–3g are cross sectional elevation views of a first preferred embodiment method of wafer bonding.
Figure 3B:
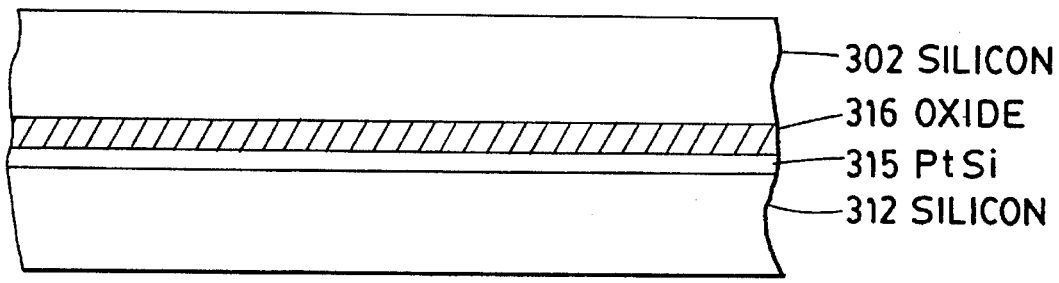
Figure 3C:
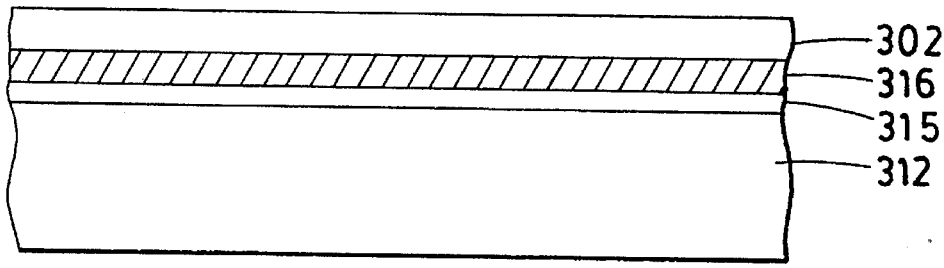
Figure 3D:
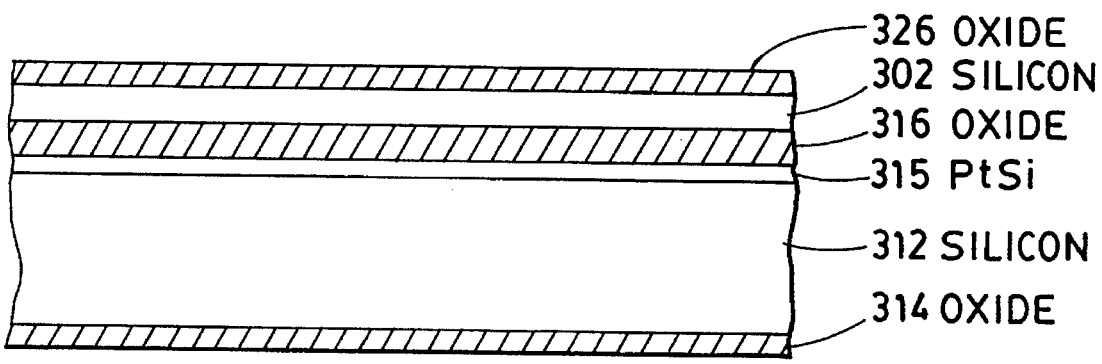
Figure 3E:
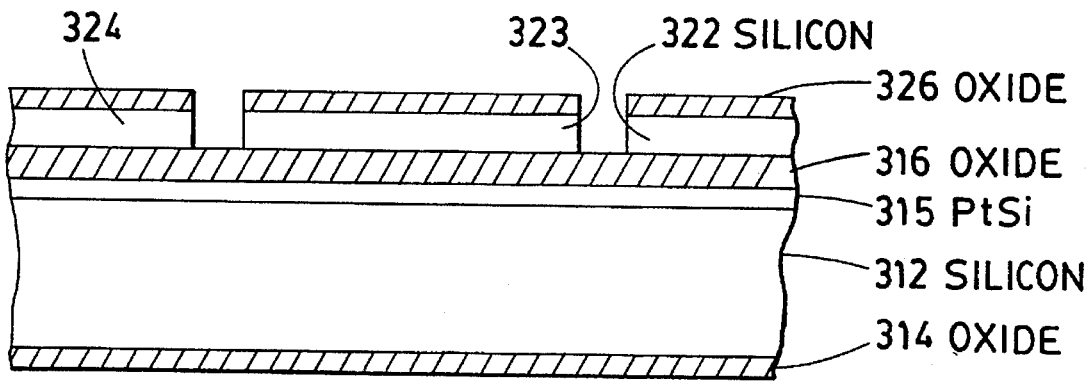
Figure 3F:
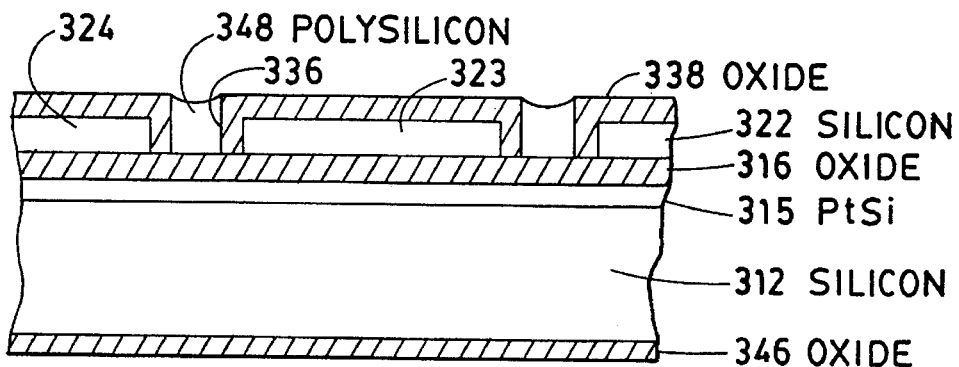

(b) Press handle wafer 312 and device wafer 302 together and heat them to 500 C in a 2–6 hour furnace cycle with a nitrogen or forming gas ambient. This drives platinum 318 to react with silicon 312 and polysilicon 317 and form platinum silicide, PtSi, and thereby bind the wafers together. Native oxide on handle wafer 312 dissolves in the PtSi and does not prevent the silicidation. This low temperature bonding depends upon the silicidation reaction and not on thermal oxidation as in the process of FIGS. 2a–c. See FIG. 3b showing PtSi layer 315. The platinum forms silicon-platinum bonds with both device wafer silicon 312 and polysilicon 317. The deposition of polysilicon 317 on oxide (or other dielectric) 316 had previously formed silicon-oxygen (or silicon-carbon or silicon-nitrogen) bonds and bound polysilicon 317 to oxide (dielectric) 316. The silicidation of polysilicon 317 retains these silicon bonds and thus binds device wafer 302 binds to handle wafer 312 through silicon/silicide and silicide/dielectric interfaces. The reaction basically is:

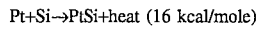

Pt+Si→PtSi+heat (16 kcal/mole)

Bonded zone PtSi 315 has a thickness of roughly 600–1000 Å.

(c) After bonding, remove the bulk of device wafer 302 by grinding, lapping, and polishing to leave the desired device island thickness; for example, 35–40 μm. This thinning of device wafer 302 proceeds without any etchstop, so the final thickness of device wafer 302 depends upon process control. See FIG. 3c. The use of an etchstop permits much smaller device island thicknesses, such as 1 μm.

(d) Deposit mask oxide 326 on device wafer 302 to a thickness of about 4 μm. PtSi is stable up to 550 C, so thermal oxidation may not be used. However, other refractory metals such as cobalt and nickel form silicides which are stable to above 900 C, so thermal oxidation could be used with bonding by such silicides. Mask oxide 326 will be used as a trench etch mask. See FIG. 3d. Thermal oxidation will also grow oxide 314 on the backside of handle wafer 312.

(e) Print a trench pattern into photoresist spun onto mask oxide 326. Note that for thermal oxidation, the bottom oxide (or other dielectric) 316 (4 μm), the mask oxide 326 (4 μm) and the backside oxide 314 (4 μm) are all fairly closely matched in thickness during the photoresist patterning, and bond silicide layer 315 is fairly thin. This provides a rough stress balance and limits warpage of the bonded wafers. Alternatively, with PtSi or other silicide with limited temperature stability and deposited mask oxide, the process temperature cycling has had limited excursions, so warpage is not as great a problem. Use the patterned photoresist as etch mask to wet etch (HF) the trench pattern in oxide 326. Then strip the photoresist and use the patterned oxide 326 to plasma reactive ion etch (RIE) device wafer 302 to form silicon islands 322, 323, . . . on oxide layer 316. This etch stops on oxide or other dielectric 316; see FIG. 3e.

(f) Strip patterned oxide 326 with a wet etch. This etch also removes the remaining backside oxide 314 on the back of handle wafer 312. Then thermally grow or conformally deposit (depending upon silicide thermal stability) oxide to a thickness of 4 μm to form isolation oxide 336 on the sides of islands 322, 323, . . . This also forms 4 μm of oxide 338 on the island surfaces and 4 μm of backside oxide 346 on handle wafer 312. Next, deposit polysilicon 348 to fill the trenches. Lastly, planarize to remove the polysilicon except from the trenches. See FIG. 3f. Note that again the island surface oxide 338, bottom oxide 316, and backside oxide 346 all have about the same thickness (4 μm) which limits warpage due to stress differentials.

Figure 3G:
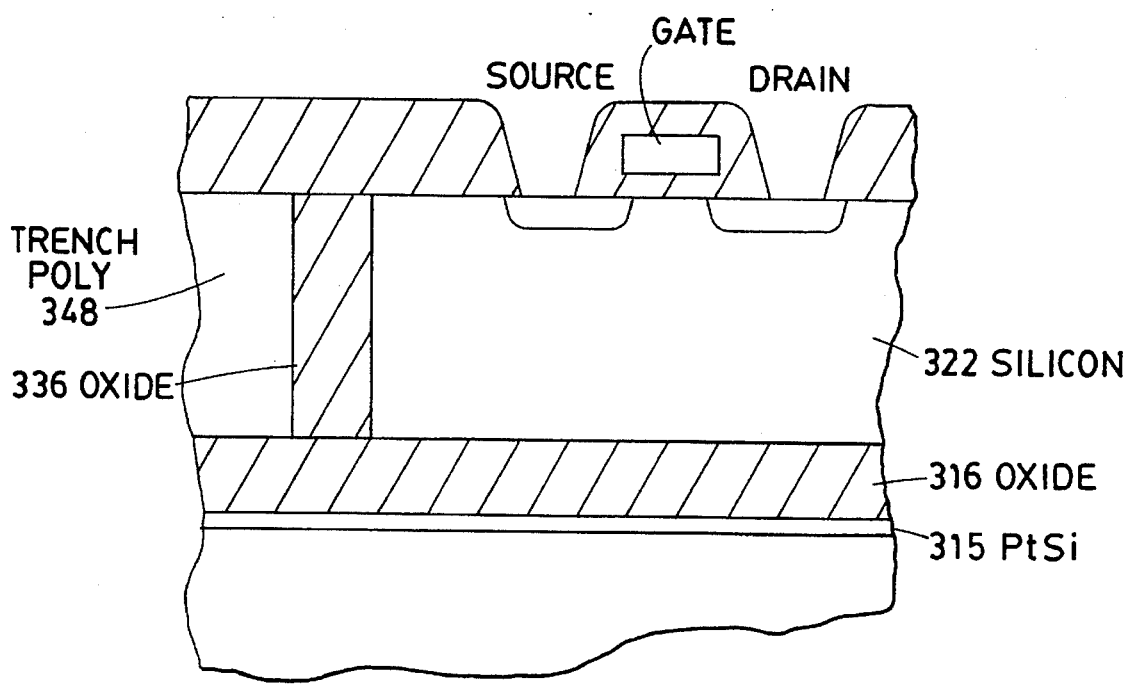

(g) Fabricate devices in the silicon islands. The particular fabrication steps used will depend upon the types of devices, interconnection structure, and insulations desired and can include oxide growth and deposition, photoresist patterning, wet and dry etches, diffusions and implants, various material depositions such as polysilicon and nitride, epitaxial layer growth, deposition of various metals such as aluminum an tungsten, and chemomechanical polishing. FIG. 3g schematically shows in expanded cross sectional elevation view a partially completed MOSFET in island 322 which would be just one of thousands of such devices in an integrated circuit fabricated on the bonded wafer.

An advantage of silicon-on-insulator integrated circuits with devices overlying bottom oxide (or other dielectric) 316 plus bond PtSi (or other silicide) layer 315 rather than just bottom oxide layer 316 alone includes their extra charge dissipation along silicide layer 315, their better thermal dissipation in the case of diamond films 316 along silicide 315, and their silicide diffusion barrier to prevent contaminants from diffusing upward from the handle wafer or bonding zone. In addition, these integrated circuits were produced on wafers which had much lower thermal budgets due to the low temperature wafer bonding or silicidation. This results in less inherent stress, especially in the case of diamond films 316, and less dopant and contaminant diffusion.

Dielectrically Isolated Silicidation Bonding

Figure 4A:
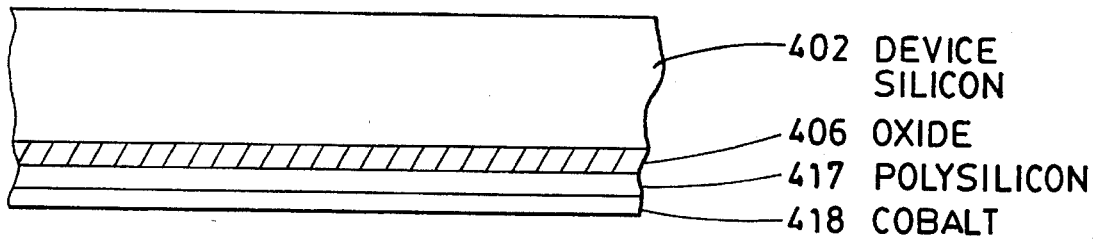
FIGS. 4a–4d are cross sectional elevation views of a second preferred embodiment method of wafer bonding.
Figure 4B:
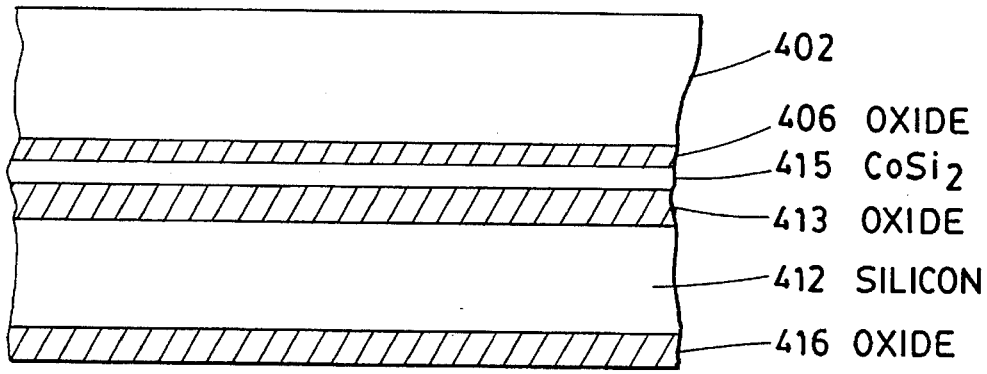
Figure 4C:
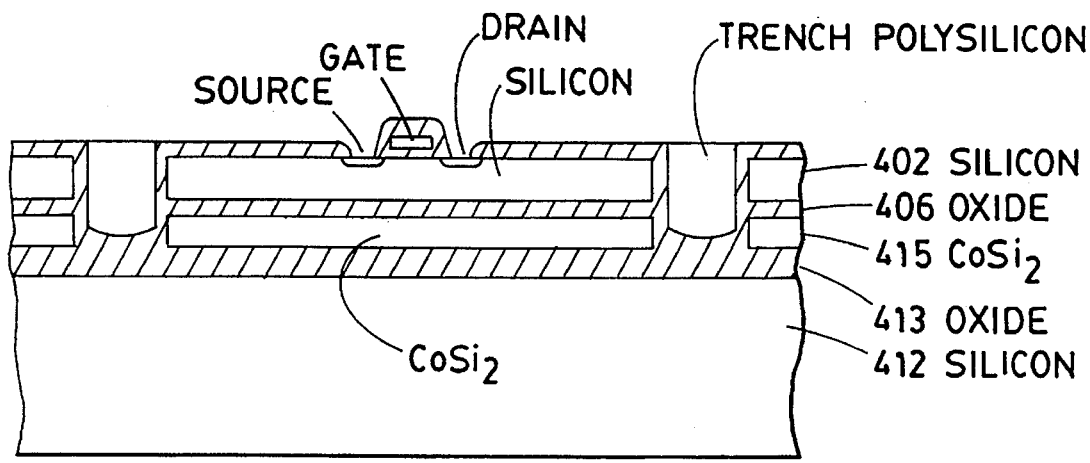

FIGS. 4a–c illustrate in cross sectional elevation view a second preferred embodiment method of bonded wafer processing.

(a) Begin with a six inch diameter 600 μm thick silicon device wafer 402 and a comparable diameter 600 μm thick silicon handle wafer 412. Device wafer 402 has the doping type and resistivity, including any buried layer doping, desired for eventual device fabrication and has a 500 Å thick thermal oxide layer 406, 500 Å thick polysilicon layer 417, and 1000 Å thick cobalt layer 418 on its bonding surface. Thermally oxidize handle wafer 412 to form oxide layers 414 and 413. Oxide 413 will become the bottom oxide, so the oxide is grown to the desired bottom oxide thickness; for example, 3 μm. Again, alternative bottom dielectrics could be deposited: diamond, nitride, oxynitride, multiple layers of different dielectrics, and so forth. Oxide 414 provides stress compensation to restrain warpage. Deposit 500 Å thick polysilicon layer 414 on oxide (dielectric) 413; see FIG. 4a. The deposition of polysilicon may be by silane decomposition and the deposition of cobalt may be by sputtering.

(b) Press handle wafer 412 and device wafer 402 together and heat them to 800 C in a 2–6 hour furnace cycle with a nitrogen or other inert ambient. This drives cobalt 418 to react with polysilicon 414 and polysilicon 417 and form cobalt silicide, $CoSi_2$, and thereby bind the wafers together. This low temperature bonding depends upon the silicidation reaction and not on thermal oxidation as in the process of FIGS. 2a–c. See FIG. 4b showing $CoSi_2$ layer 315. The cobalt forms silicon-cobalt bonds with both polysilicon 414 and polysilicon 417. The deposition of polysilicon 417 on oxide 406 had previously formed silicon-oxygen bonds and bound polysilicon 417 to oxide 406; similarly, polysilicon 414 is bound to oxide 413. The silicidation of polysilicon 414 and 417 retains these silicon/oxygen bonds and thus binds device wafer 402 binds to handle wafer 412 through silicon/oxide and silicide/oxide interfaces. Bonded zone $CoSi_2$ 415 has a thickness of roughly 600–1000 Å. Note that cobalt forms the silicide in preference to reducing the oxide by $SiO_2+Co\rightarrow Si+CoO_2$.

(c) After bonding, remove the bulk of device wafer 402 by grinding, lapping, and polishing to leave the desired device island thickness; for example, 20 μm. This thinning of device wafer 402 proceeds as in the first preferred embodiment, as does subsequent device fabrication. Because thermal oxide 406 is quite thin, the trench etch will remove it, and the exposed $CoSi_2$ can then also be removed. Then a trench sidewall oxidation plus conformal oxide deposition will isolate the $CoSi_2$ layer under each silicon island between the trenches. See FIG. 4c.

Figure 4D:
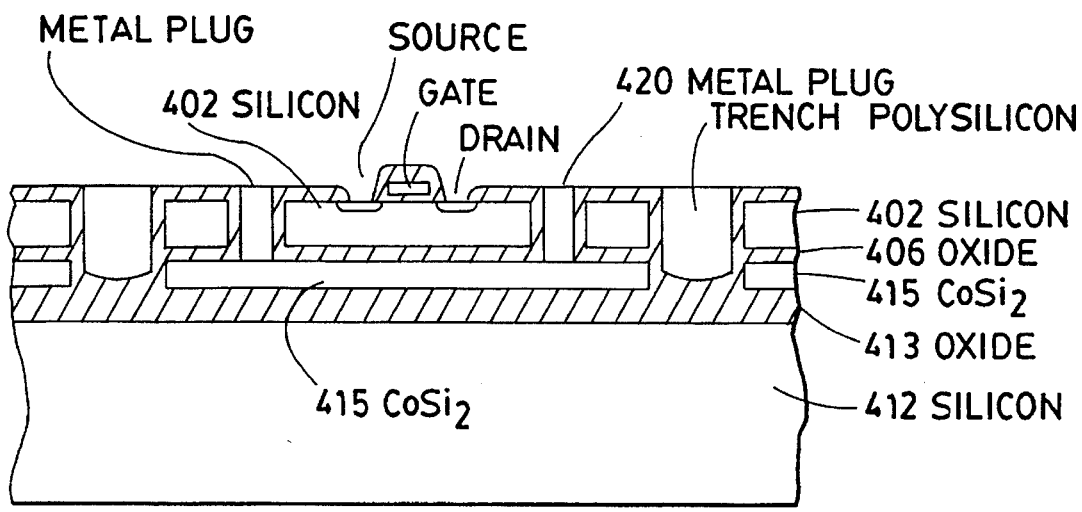

The structure of the second preferred embodiment has the advantage that $CoSi_2$ layer 415 can act both as a resistor under each silicon island and as a diffusion barrier for impurities diffusing out of bottom oxide (dielectric) 413 during processing. Thin thermal oxide 406 provides the electrical isolation of $CoSi_2$ 415 from its silicon island. Such buried resistors help in three-dimensional integration by allowing vertical integration, thus providing smaller die geometries. FIG. 4d illustrates use of $CoSi_2$ as a resistor stacked directly below the silicon island. In particular, contacts to $CoSi_2$ 415 may be made by another trench etch which stops on the silicide followed by oxidation of trench sidewalls and filling with a metal plug 420 such as tungsten. This resistor contact formation may be most convenient with thin silicon islands; that is, when silicon 402 is about 2 μm of less in thickness. The resistance of such resistors may be adjusted by varying the silicide thickness/composition or silicon island size.

Silicidation Plus Oxidation Bonding

Figure 5A:
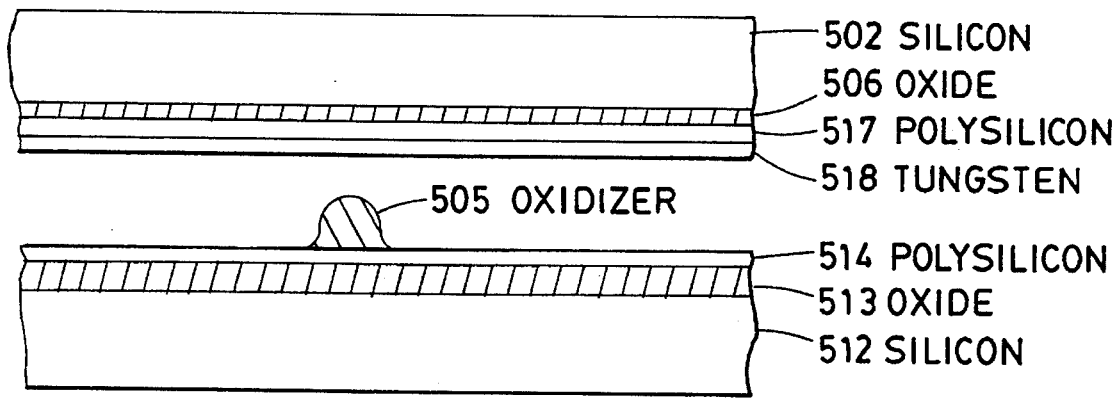
FIGS. 5a–5b shows in cross sectional elevation view a third preferred embodiment method of wafer bonding.
Figure 5B:
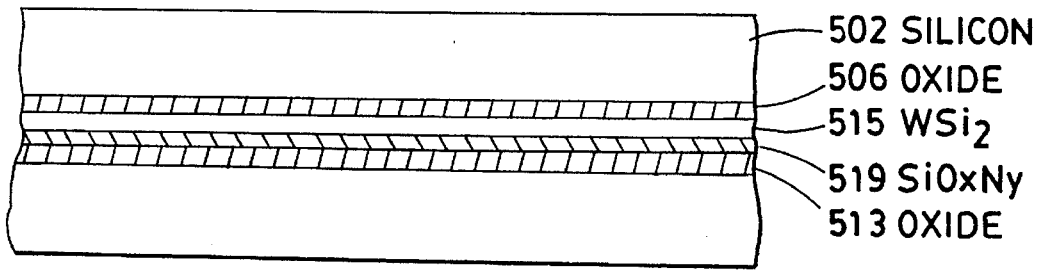

FIGS. 5a–b illustrate in cross sectional elevation view a third preferred embodiment method of bonded wafer processing.

(a) Begin with a six inch diameter 600 μm thick silicon device wafer 502 and a comparable diameter 600 μm thick silicon handle wafer 512. Device wafer 502 has the doping type and resistivity desired for eventual device fabrication and has a 500 Å thick thermal oxide layer 506, 500 Å thick polysilicon layer 517, and 1000 Å thick tungsten layer 518 on its bonding surface. Thermally oxidize handle wafer 512 to form oxide layer 513. Oxide 513 will become the bottom oxide, so the oxide is grown to the desired bottom oxide thickness; for example, 2 μm. Deposit 500 Å thick polysilicon layer 514 on oxide 513. The deposition of polysilicon may be by silane decomposition and the deposition of tungsten may be by sputtering. Place drop 505 of oxidizing aqueous solution of $HNO_3$ and $H_2O_2$ on polysilicon 514; see FIG. 5a. Drop 505 is 20% by volume a 67% $HNO_3$ solution and 80% by volume a 30% $H_2O_2$ solution. Other mixtures also work. Drop 505 has a volume of about 0.05 cc which implies 4.0 microliters per square inch of wafer surface and theoretically will spread out to a layer with thickness (if uniform) of 6 μm on polysilicon 514. Note that drop 505 wets the surface of polysilicon 514. (Drop volume in the range of 4 to 10 microliters per square inch of wafer surface leads to good bonding.)

(b) Press handle wafer 512 and device wafer 502 together with drop 505 of first preferred embodiment oxidizer on the surface of polysilicon 514. Let the pressed together wafers dry for 24 hours and then heat them to 900 C in a 2–6 hour furnace cycle with an oxidizing ambient. This drives polysilicon 517 to react with tungsten 518 to form tungsten silicide, $WSi_2$, and drives oxidizer 505 to react with polysilicon 514 to form silicon oxynitrides ("nitrox"). The tungsten also reacts with the nitrox to thereby bind the wafers if polysilicon 514 is consumed. See FIG. 5b. The tungsten forms tungsten-silicon bonds, and the nitrate forms both silicon-oxygen and silicon-nitrogen bonds. The water primarily evaporates. The reactions basically are:

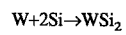

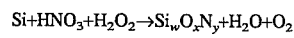

The oxidizer in drop 505 oxidizes the portion of polysilicon 514 not consumed by the silicidation. This creates a bonded zone with a mixture of nitrox 519 connecting bottom oxide 513 plus handle wafer 502 to silicide 515 plus oxide 506 and device wafer 502. Bonded zone nitrox 519 has a thickness of roughly 500–800 Å and silicide layer 515 has a thickness of about 800–1000 Å. Of course, increasing the ratio of $HNO_3$ to $H_2O_2$ in oxidizer drop 505 will increase x and decrease y and somewhat increase the thickness of bonded zone nitrox 315; and conversely for a decrease in the ratio. If there is a shortage of polysilicon, then the oxidizer oxidizes the silicide:

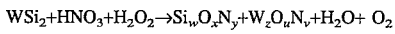

$$WSi_2+HNO_3+H_2O_2 \to Si_wO_xN_y+W_zO_uN_v+H_2O+O_2$$

(c) After bonding, remove the bulk of device wafer 502 by grinding, lapping, and polishing to leave the desired device island thickness and fabricated devices as with the first preferred embodiment. As with the second preferred embodiment, the silicide layer may be isolated under each silicon island and form a buried resistor. The resistance of such resistors may be adjusted by varying the thickness of the polysilicon and tungsten (or other metal) layers in the initial wafers and/or the size of each device islands.

Method With Silicides

The fourth preferred embodiment method of bonded wafer processing follows the steps of any of the first three preferred embodiments but replaces the metal (platinum, cobalt, and tungsten) with a silicide (or metal plus silicide mixture) which can further react with silicon. For example, $TiSi+Si \to TiSi_2$. Again, the buried dielectric could be diamond, nitride, nitrox, multilayered, and so forth.

Diamond Buried Dielectric

Figure 6:
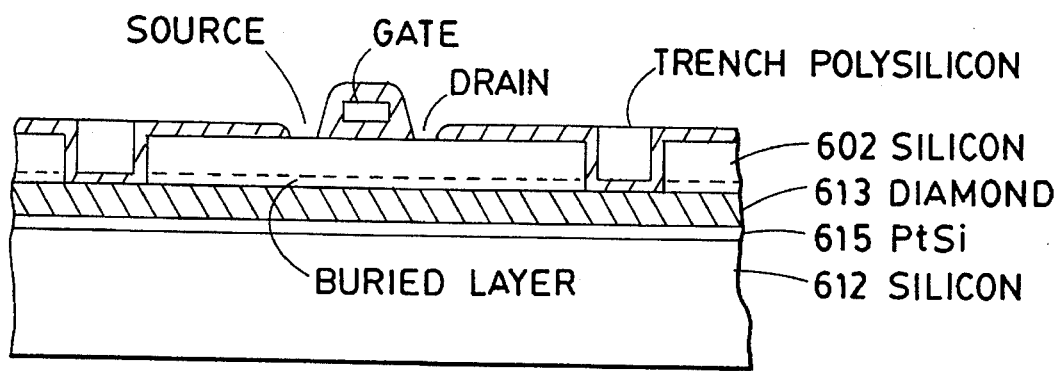
FIG. 6 is a cross sectional elevation view of a completed bonded wafer with diamond buried dielectric.

FIG. 6 shows a cross sectional elevation view of a buried diamond structure in which device wafer 602 had diamond film 613 grown and then polysilicon deposited on the diamond and platinum deposited on the polysilicon. The polysilicon and the handle wafer silicon both react with the platinum to form PtSi 615 to bind the wafers at 500 C as in the first preferred embodiment method. Diamond 613 requires low temperature bonding in order to avoid warpage, and the lack of any oxide layers provides high thermal conductivity from devices in device wafer 602 through diamond insulator 613 and bonding silicide 615 and into handle wafer 612. Diamond 613 and silicide 615 also provide lateral spreading of heat and limit hot spots in device wafer 602. The trench isolation in FIG. 6 includes deposited oxide, again to avoid high temperature processing of diamond film 613, and polysilicon trench filler. Devices such as the illustrative field effect transistor could be situated over buried layers which are formed by simply introducing dopants prior to the growth of diamond film 613, and these dopants to not excessively diffuse during processing because of the small thermal budget used with diamond films.

Further Modifications and Variations

The preferred embodiments may be varied in many ways while retaining the feature of a silicidation reaction for bonding wafers. For example, metal and silicon, or other silicide precursors, could be on one of or both of the device and handle wafers which are brought together to bond. Further, many different refractory metals form various silicides at various temperatures and with various temperature stability ranges. Thus, the type of dielectric and other materials involved and the processing steps to be used in device fabrication will determine thermal budgets and the choice of available silicides. For example, platinum is good for low temperature processing, whereas nickel and tungsten permit higher temperature processing. Also, some metals, such as titanium, tantalum, and platinum, easily dissolve or penetrate native oxides on wafer surfaces to form silicides, whereas cobalt is notorious for silicidation difficulties in the presence of native oxides. Note that for many metals the metal migrates in the silicon to form silicides, but for tungsten, the silicon migrates in the metal; this difference permits differing bonding zone reaction systems. Lastly, the metal may be chosen to minimize the differences between thermal coefficients of expansion of the silicide, dielectric, and wafers.

Device Characteristics

Devices and integrated circuits fabricated in silicon-on-insulator of the bonded wafers of the preferred embodiment methods and then diced have the following properties:

(a) Stress compensation due to incorporation of buried layers with closely matched thermal coefficients of expansion substrates and buried films.

(b) Layers which can function as diffusion barriers to limit the diffusion of mobile contaminants.

(c) Low temperature bonding which allowed (i) dopants profiles in the device wafer from pre-bonding processing due to low thermal budgets of the silicidation bonding, and (ii) stress reduction and less warpage, especially for diamond dielectric.

(d) Buried layers which are dielectrically isolated and which can function as resistor films.

(e) Buried layers which can better dissipate thermal energy transferred through thermally conductive diamond films.

What is claimed is:

1. A method of fabrication of integrated circuits, comprising the steps of:

(a) providing a device wafer with a surface silicon layer covering a dielectric layer and a handle wafer with a surface silicon layer;

(b) depositing a refractory metal layer on one of said silicon surface layers and joining the device wafer surface silicon layer to the handle wafer surface silicon layer with the refractory metal layer therebetween;

(c) heating said wafers wherein said waters bond together through formation of silicide-silicon bonds to both surface silicon layers;

(d) thinning said device wafer;

(e) forming trenches in said device wafer and extending through said device wafer to said dielectrically-coated layer;

(f) forming devices in the portions of said device wafer among said trenches.

2. The method of claim 1, wherein:

(a) said trenches extend through said silicide and thereby form isolated silicide areas under said portions of said device wafer among said trenches.

3. The method of claim 1, wherein:

(a) said device wafer and said handle water are silicon;

(b) said dielectrically-coated layer of said device wafer is a diamond-coated layer;

(c) said device surface silicon layer comprises polysilicon and the refractory metal layer comprises platinum.

4. The method of claim 1 wherein said dielectric layer is disposed between the silicide bond and the devices and said silicide prevents contaminants from entering said dielectric layer and said devices.

5. The method of claim 1 wherein the device surface silicon layer is a continuous, unbroken layer.

6. A method of wafer bonding to a produce silicon-on-insulator structure; comprising the steps of:
   (a) providing a device wafer and a handle wafer wherein said device wafer includes a silicon layer over a diamond layer;
   (b) joining the silicon layer covering the diamond layer of said device wafer to a surface of said handle water with silicide precursors therebetween; and
   (c) heating said wafers wherein said wafers bond together through silicide-silicon bond formation on both wafers.

7. The method of claim 6, wherein:
   (a) said precursors include a layer of refractory metal on said silicon layer covering the diamond layer and a silicon surface on the handle wafer.

8. The method of claim 7, wherein said metal is platinum.

9. The method of claim 7, wherein said metal is selected from the group consisting of cobalt, nickel, tungsten, titanium, tantalum, and combinations thereof.

10. The method of claim 6, wherein said handle wafer has a dielectric layer at said surface.

11. The method of claim 6, further comprising the step of providing a liquid oxidizer between the joined surfaces.

12. The method of claim 6 wherein said dielectric layer is disposed between the silicide bond and the devices and said silicide prevents contaminants from entering said dielectric layer and said devices.

13. The method of claim 6 wherein the silicon layer covering the diamond layer is continuous and unbroken.

* * * * *